United States Patent [19]

Annamalai

[11] Patent Number: 5,186,785
[45] Date of Patent: Feb. 16, 1993

[54] ZONE MELTED RECRYSTALLIZED SILICON ON DIAMOND

[75] Inventor: Nagappan K. Annamalai, Nashua, N.H.

[73] Assignee: The United States of America as represented by the Secretary of the Air Force, Washington, D.C.

[21] Appl. No.: 688,637

[22] Filed: Apr. 5, 1991

[51] Int. Cl.$^5$ ............................................. C30B 19/00
[52] U.S. Cl. .................................. 156/613; 156/620.7; 156/620.71; 156/DIG. 64; 156/DIG. 65; 156/DIG. 68; 156/DIG. 80; 156/DIG. 88; 156/DIG. 105; 156/DIG. 111; 437/109; 437/233; 437/235
[58] Field of Search ................ 156/613, 620.7, 620.71, 156/DIG. 64, DIG. 65, DIG. 68, DIG. 80, DIG. 88, DIG. 105, DIG. 111; 437/109, 233, 235

[56] References Cited

U.S. PATENT DOCUMENTS

| | | | |
|---|---|---|---|
| 4,323,417 | 4/1982 | Lam | 156/613 |
| 4,444,620 | 4/1984 | Kovacs et al. | 156/657 |
| 4,559,102 | 12/1985 | Hayafuji | 156/605 |
| 4,592,799 | 6/1986 | Hayafuji | 156/617 R |
| 4,783,368 | 11/1988 | Yamamoto et al. | 428/408 |
| 4,885,052 | 12/1989 | Fan et al. | 156/620.7 |
| 4,925,701 | 5/1990 | Jansen et al. | 427/38 |

FOREIGN PATENT DOCUMENTS 2263789  10/1990  Japan.

OTHER PUBLICATIONS

Ravi, K. V. et al, "Silicon on Insulator Technology Using CVD Diamond Films", paper presented at First International Symposium on Diamond and Diamond--Like Films, spring meeting of The Electrochemical Society, Los Angeles, Calif. May 1989.

*Primary Examiner*—Olik Chaudhuri
*Assistant Examiner*—Felisa Garrett
*Attorney, Agent, or Firm*—William G. Auton; Donald J. Singer

[57] ABSTRACT

In silicon-on-diamond (SOD) technology, diamond replaces the silicon-dioxide in the silicon-on-insulator structure. Diamond is good thermal conductor unlike silicon dioxide and a good electrical insulator like silicon dioxide. A high grade, high purity device-quality silicon wafer is chosen. An insulating diamond film of about 0.5 um or any suitable thickness is grown on the whole silicon wafer, including the rim area. A polycrystalline silicon of about 2 microns thick or so is then deposited on the whole wafer, including the rim area. Using the rim area silicon as the seed the polycrystalline silicon crystallizes into a single crystal by a zone melting recrystallization technique. The rim area is scribed off the wafer, leaving a recrystallized silicon-on-diamond (FIG. 1d). The structure top to bottom is recrystallized silicon-diamond and silicon-substrate. The structure is similar to ZMR SOI, but the insulator here is diamond instead of silicon dioxide and is therefore called ZMR SOD. The devices, such as MOSFETS, Bipolar transistors, JFETS and diodes, are fabricated in the recrystallized silicon that sits on top of the diamond film.

16 Claims, 2 Drawing Sheets

ZONE MELTED RECRYSTALLIZED SILICON ON DIAMOND

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to devices fabricated on thin silicon films, and more specifically the invention pertains to radiation-resistant silicon substrate and for high temperature operation of devices grown on insulating diamond films.

Recently, there has been increased interest in recrystallizing thin layers of semiconductor material, especially silicon, on a buried noncrystalline insulator layer as in, semiconductor-on-insulator technology. Typically, a layer of insulator material is formed on a semiconductor substrate and, patterned, a layer of semiconductor material, is deposited thereover, the semiconductor layer is melted in whole or in part, and one or more solidification fronts are caused to advance laterally across the semiconductor layer. See, for instance, U.S. Pat. No. 4,323,417, issued Apr. 6, 1982 to H. W. Lam, the disclosure of which is incorporated herein by reference. Electronic devices based on buried insulator structures offer promise of, increased dielectric isolation, useful in, high voltage-high power devices, reduced parasitic capacitance in integrated circuits, and of improved radiation hardness of devices. Common buried insulator is silicon dioxide. While these devices have proven excellent, the search continues for radiation resistant silicon substrate devices, which could operate at high temperatures.

A promising buried insulator candidate is diamond. Diamond films have a resistivity of $10^{16}$ ohm-cm, and are excellent electrical insulators. The task of producing a recrystallized silicon layer on diamond device is alleviated, to some extent, by the systems disclosed in the following U.S. Patents, the disclosures of which are incorporated herein by reference:

U.S. Pat. No. 4,444,620 issued to Kovacs et al;
U.S. Pat. No. 4,885,052 issued to Fan et al;

The use of silicon with diamond films is discussed in the article entitled "Silicon on Insulator using CVD Diamond Films" by K. V. Ravi and M. I. Landstrass. This paper was presented at the First International Symposium on Diamond and Diamond-Like Films by, in the Electrochemical Society Meeting, Los Angeles, Calif., May 1989, and is incorporated herein by reference.

Silicon-on-diamond is a form of silicon-on-insulator technology. Silicon-on-diamond with a very high electrical resistivity and thermal conductivity diamond film is suitable for developing high temperatures, high speed ultra large scale integrated (ULSI) circuits. This structure is suitable for radiation hardened applications. In silicon-on-diamond (SOD) technology, diamond replaces the silicon dioxide in the silicon-on-insulator structure. Diamond is a good thermal conductor, unlike silicon dioxide, and is a good electrical insulator, like silicon dioxide.

SUMMARY OF THE INVENTION

The present invention includes a process for fabricating radiation resistant silicon substrate based devices of zone melted, recrystallized silicon on diamond insulator films. The process begins by growing a 0.5 micron thick or a suitable thickness diamond insulating film on a silicon wafer such that the wafer has an exposed outer rim which circumscribes the diamond film.

Next, a polysilicon coating is deposited over the diamond film so that the polysilicon coating contacts the rim of the silicon wafer. Exposure of the wafer to heat at temperatures of 1,400° C. recrystallizes the polysilicon coating into a single recrystallized silicon crystal.

After the zone melted recrystallization treatment is administered, the rim of the silicon wafer is removed off to complete the recrystallized silicon wafer. This finished product is believed to be a radiation resistant silicon substrate upon which high quality semiconductor devices may be fabricated.

It is an object of the present invention to provide a zone melted recrystallized silicon on diamond deposited silicon wafer that is radiation resistant.

It is another object of the present invention to make a semiconductor wafer that utilizes the thermal conductivity and high electrical insulation properties of thin diamond films.

These objects together with other objects, features, and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a radiation - resistant silicon substrate device which is grown on an electrically insulating diamond film.

Figure 1E:
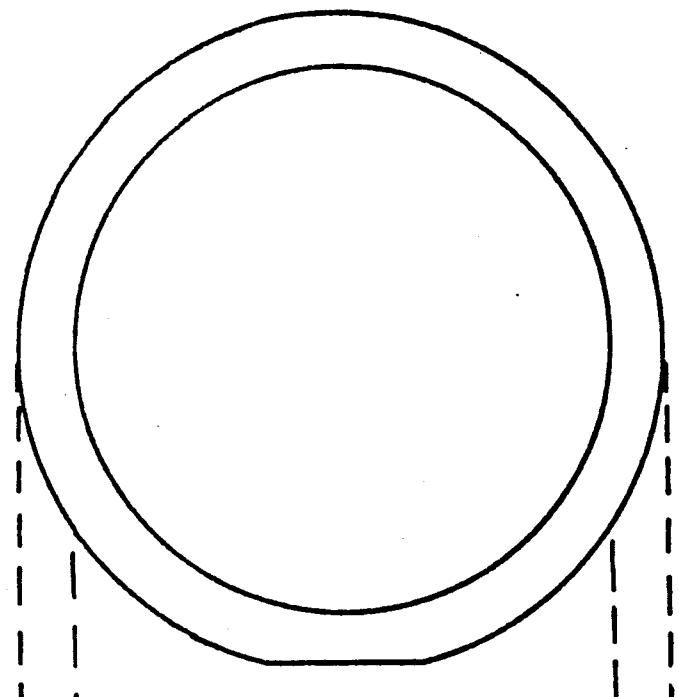
FIGS. 1a–1e are views of the sequence of fabrication steps for fabricating an embodiment of the present invention.
Figure 1A:
Figure 1B:
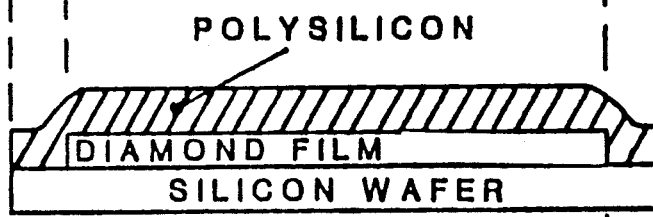
Figure 1C:
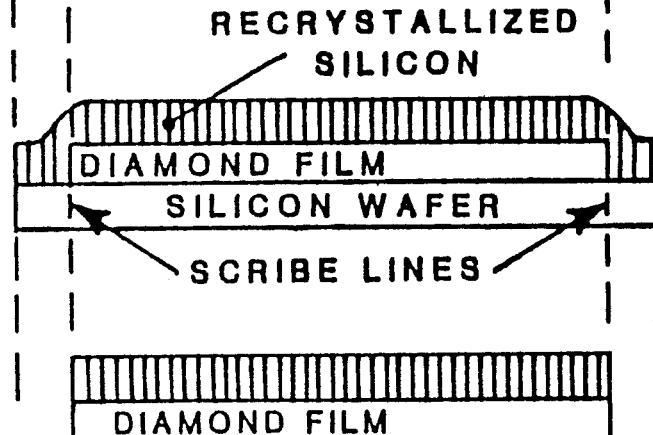

The readers attention is now directed towards FIGS. 1a–1e which depict the sequence of steps in which the present invention is fabricated. As shown, a (3" to 8" diameter although other sizes could be used) high grade, high purity device-quality silicon wafer is used. An insulating diamond film of 0.5 um thick (or any thickness technology permits) is grown on the whole silicon wafer, except for a rim about ¼" wide (FIG. 1a). A polycrystalline silicon layer of 2 um thickness or more (or any thickness technology permits) is then deposited on this wafer covering the whole wafer, including the rim area (FIG. 1b). Using the rim area silicon as the seed the polycrystalline silicon is crystallized into a single crystal by a zone melting recrystallization technique.

Zone-melting recrystallization (ZMR) is a process for producing thin crystalline films of silicon (Si) isolated from a silicon substrate by a buried insulating layer, i.e., $SiO_2$. In the prior art ZMR process, a layer of $SiO_2$ is deposited on a substrate, often a single-crystal wafer. Polycrystalline Si (polysilicon) is then deposited on the $SiO_2$ layer, followed by deposition of a capping layer or a wetting agent, such as, $SiO_2$. This structure is then subjected to a heat treatment wherein the polysilicon film is melted.

Typically, the heating is performed using a stationary bottom heater adjacent to the substrate surface. The stationary heater elevates the temperature of the polysilicon to about 1000° C., near its melting point. A movable upper heating source is then translated past the structure adjacent to the capping film to supply sufficient heat to melt the polysilicon as the heating source moves along its path. Upon recrystallization the polysilicon film is transformed to a single, or nearly single crystalline film. Optionally, a single crystal seed material may be used to aid in epitaxial recrystallization. (See U.S. Pat. No. 4,371,421 to Fan et al.)

Figure 1D:

Silicon-on-Insulator (SOI) material prepared by the ZMR technique promises to satisfy the material needs for many important device applications, including radiation-hardened circuits, high temperature operation circuits, high voltage circuits, very high speed computating circuits, microsensors etc. In the present invention, the polysilicon layer is zone melted with the silicon layer to encapsulate the diamond insulator. Next, the rim area is scribed off the wafer (FIG. 1c), leaving a recrystallized silicon-on-diamond structure (FIG. 1d). The structure from top to bottom is recrystallized silicon, diamond, silicon substrate. The structure is similar to ZMR SOI, but the insulator here is diamond instead of silicon dioxide and is therefore called ZMR SOD. Devices can be fabricated in the recrystallized silicon layer that sits on top of the diamond film. FIG. 1e is a plain view of the wafer which shows the wafer diameter with a ¼ inch rim (any suitable rim area could also be used) that is to be trimmed after the ZMR step.

It is also possible to grow a thick diamond film on silicon, with a ¼" rim (any size rim suitable for recrystalllized system) as discussed above (FIG. 2a). A polysilicon film is deposited on the whole wafer and recrystallized by a ZMR technique (FIG. 2b). The silicon substrate is etched off to yield a recrystallized silicon and a (stand alone) diamond film (FIG. 2c). The structure is mounted on a heat sink (FIG. 2c) and the rim is scribed off (FIG. 2d). The final structure is recrystallized silicon on diamond mounted on a heat sink (FIG. 2e).

Figure 2E:
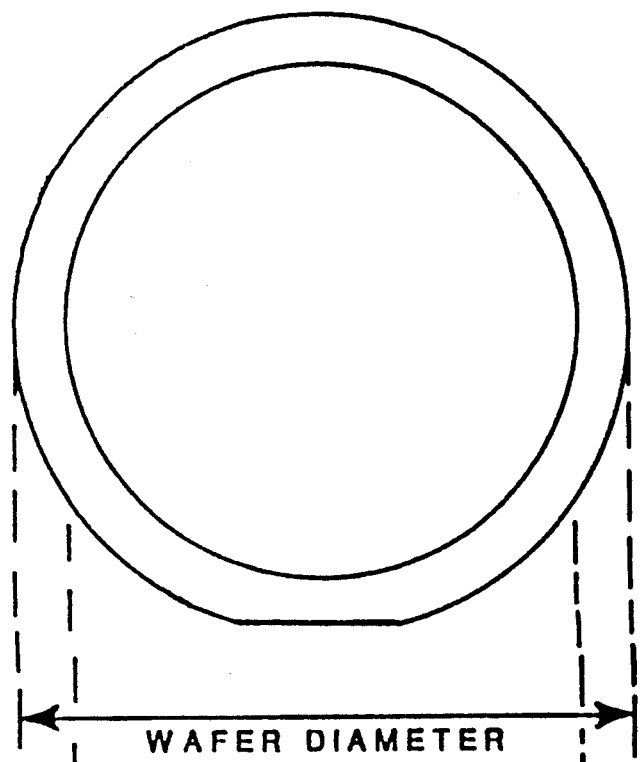
FIGS. 2a–2e are views of a second sequence of fabrication steps for fabricating a second embodiment of the present invention.
Figure 2A:
Figure 2B:
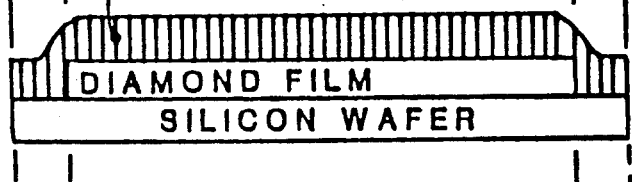
Figure 2C:
Figure 2D:
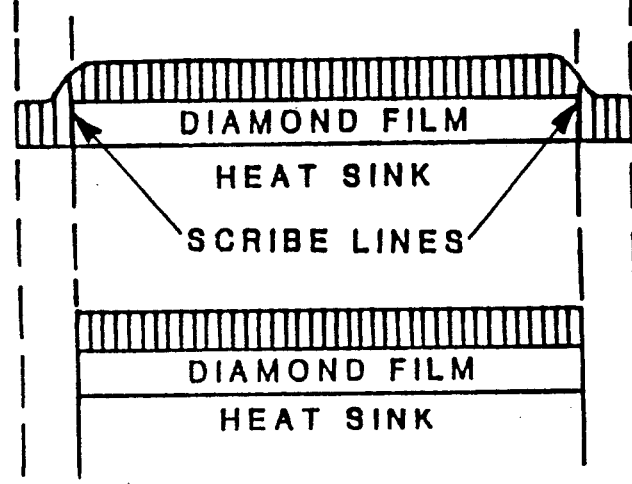

In FIG. 2e, the heat sink is a mounting base, usually metallic, that dissipates, carries away, or radiates into the surrounding atmosphere the heat generated by a semiconductor device. The package of the device often serves as a heat sink, but, for devices of higher power, a separate heat sink on which one or more packages are mounted is required to prevent overheating and subsequent destruction of the semiconductor junction.

In the present invention, the heat sink may be a mass of metal that is added to a device structure for the absorption or transfer of heat away from critical parts. It is generally made from aluminum to achieve high heat conductivity and minimum added weight. Most heat sinks are of one-piece construction. They may also be designed for mounting on printed-circuit boards.

In one embodiment of the invention, the heat sink may be a metal part with a large surface area to facilitate the removal of heat. This heat sink may have fins mounted on or under a circuit component which produces heat, such as a power transistor, silicon rectifiers, etc. The heat sink absorbs and then radiates the heat to maintain a safe working temperature for the component.

As mentioned in the above-cited Ravi et al reference, the use of diamond films with silicon has a number of advantages. Diamond has a dielectric constant of 5.5 and an electrical resistivity of $10^{16}$ ohm cm. The Ravi et al wafer is described as having: a silicon top layer, a diamond insulation layer, and a polysilicon substrate. The present invention has a recrystallized silicon top layer, a diamond insulation layer, and a silicon substrate which may be mounted on a heat sink. The objective of this effort is to apply the radiation hardness properties of insulating diamond films grown on silicon substrates and of devices fabricated in thin recrystallized silicon films forming a silicon-on-diamond (SOD) structure to fabricate silicon rad-hard, high temperature, high speed circuits.

The following electronic properties are of interest in using diamond film as an insulating layer. Diamond is probably rad hard because it has high bond energy, low neutron cross section, and high band gap. Diamond is an electrical insulator and an excellent thermal conductor, and it is therefore, an ideal candidate to replace $SiO_2$ in a SOI structure. The SOD structure instead of the SOI structure is thus ideal for fabricating rad hard circuits.

There are a few small commercial companies growing diamond films on silicon, one of which is the crystalline company of Menlo Park, Calif.

As described above, the present invention can be considered a process of fabricating radiation hardened, high speed, small feature size and ultra large scale integrated (ULSI) MOSFET and other integrated circuits. This process may be referred to as zone melted recrystallized silicon on diamond (ZMR SOD) and is described below. The first step of the process entails growing an 0.5 micron thick or any suitable thickness insulating diamond film on a silicon wafer. The above-cited Ravi et al reference describes the use of plasma enhanced chemical vapor deposition of diamond to fabricate a wafer silicon-on-diamond that includes a silicon layer on top and one polysilicon layer at bottom. Referring back to FIG. 1a, the silicon wafer of any diameter wafer with a ¼ inch or suitable size rim circumscribing the diamond film.

The second step of the process entails depositing a polysilicon layer of two microns or any suitable thickness over diamond and silicon wafer, as shown in FIG. 1b. Polysilicon deposition techniques are well known in the art, and need not be redescribed here.

In the third step of the process, the polysilicon layer is converted to a recrystallized silicon single crystal using zone melting recrystallization. In the zone-melting method, the sample, e.g., a wafer, is typically coupled to a heat source that maintains the sample at a temperature slightly below the melting temperature of the semiconductor material, and a strip-like hot zone (in which the semiconductor material is molten) is scanned across the sample. A variety of means exists for producing the moving hot zone, e.g., a line-focused laser or other light source, or an electron beam. Graphite strip heaters are also used in the prior art. As described in the above-cited Kovacs patent, various heat sources are used to melt the thin semiconductor layers, including strip heaters, electron or laser irradiation, and irradiation with high intensity radiation from, e.g., tungsten halogen lamps. Various techniques for recrystallization are also known to the art. Among the techniques is a global melting approach, typically comprising simultaneous exposure of a whole wafer to high intensity visible and infrared radiation. In this step, the recommended temperature is 1400° C. for the particular thickness of polysilicon being used.

Once the zone melting recrystallation step is complete, the rim edge is trimmed off, and a complete wafer is ready for use for semiconductor device fabrications.

The diamond films on silicon are radiation hard, good thermal conductors and good electrical insulators and are therefore ideal as substrates for developing radiation hard silicon VLSI circuits. Diamond is a good thermal conductor suitable for developing small geometry devices, thus increasing the frequency of operation. As a good electrical insulator it reduces the active volume of silicon on top, thereby making it a suitable to fabricate radiation hard circuit.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A process for fabricating a recrystallized silicon wafer, said process comprising the steps of:
   growing a diamond film on a silicon wafer such that the silicon wafer has an exposed outer rim which circumscribes the diamond film;
   depositing a polysilicon coating over the diamond film so that the polysilicon coating contacts the rim of the silicon wafer;
   recrystallizing the polysilicon coating into a recrystallized layer; and
   trimming the rim of the silicon wafer to finish thereby the recrystallized silicon wafer.

2. The recrystallized silicon wafer formed by the process of claim 1.

3. A process as defined in claim 1, wherein said growing step endows said diamond film with a thickness of about 0.5 microns.

4. The recrystallized silicon wafer formed by the process of claim 3.

5. A process, as defined in claim 1, wherein said depositing step endows said polysilicon coating with a thickness of about two microns.

6. The recrystallized silicon wafer formed by the process of claim 5.

7. A process as defined in claim 5 wherein said growing step endows said diamond film with a thickness of about 0.5 micron.

8. The recrystallized silicon wafer formed by the process of claim 7.

9. A process, as defined in claim 1 wherein said recrystallizing step is accomplished by zone melting said polysilicon coating by heating it to a temperature of about 1,400° C. to recrystallize it into a single recrystallized silicon crystal.

10. The recrystallized silicon wafer formed by the process of claim 9.

11. A process as defined in claim 9, wherein said growing step endows said diamond film with a thickness of about 0.5 micron.

12. The recrystallized silicon wafer formed by the process of claim 11.

13. A process, as defined in claim 9, wherein said depositing step endows said polysilicon coating with a thickness of about two microns.

14. The recrystallized silicon wafer formed by the process of claim 13.

15. A process as defined in claim 13, wherein said growing step endows said diamond film with a thickness of about 0.5 micron.

16. The recrystallized silicon wafer formed by the process of claim 15.

* * * * *